United States Patent
Puttonen

(10) Patent No.: US 10,173,843 B2
(45) Date of Patent: Jan. 8, 2019

(54) CONVEYING ARRANGEMENT FOR TESTING SYSTEM

(71) Applicant: JOT Automation Oy, Oulu (FI)

(72) Inventor: Mika Puttonen, Oulunsalo (FI)

(73) Assignee: JOT AUTOMATION OY, Oulu (FI)

( * ) Notice: Subject to any disclaimer, the term of this patent is extended or adjusted under 35 U.S.C. 154(b) by 0 days.

(21) Appl. No.: 15/794,755

(22) Filed: Oct. 26, 2017

(65) Prior Publication Data

US 2018/0148265 A1    May 31, 2018

(30) Foreign Application Priority Data

Nov. 30, 2016 (FI) .................................. 20160282

(51) Int. Cl.
  *B65G 15/64* (2006.01)
  *G01R 31/28* (2006.01)

(52) U.S. Cl.
  CPC .......... *B65G 15/64* (2013.01); *G01R 31/2806* (2013.01); *G01R 31/2808* (2013.01)

(58) Field of Classification Search
  CPC ........................... B65G 15/64; G01R 31/2806
  USPC ....... 324/756.01, 756.02, 757.01; 198/346.1, 198/346.3
  See application file for complete search history.

(56) References Cited

U.S. PATENT DOCUMENTS

| | | |
|---|---|---|
| 5,680,936 A | 10/1997 | Beers |
| 7,063,204 B1 | 6/2006 | Pfeiffer et al. |
| 2002/0062555 A1 | 5/2002 | Hwang et al. |
| 2006/0105612 A1 | 5/2006 | Moncavage |
| 2007/0212174 A1 | 9/2007 | Hayashi et al. |
| 2009/0265033 A1 | 10/2009 | Baccini |

FOREIGN PATENT DOCUMENTS

| | | |
|---|---|---|
| CN | 106092210 A | 11/2016 |
| WO | 9204989 A1 | 4/1992 |

OTHER PUBLICATIONS

European Search Report for EP Application No. 17 19 6132, 2 pages, dated Feb. 19, 2018.
Finnish Office Action for corresponding Patent Application No. 20160282, dated Jun. 16, 2017, 2 pages.

*Primary Examiner* — Gene O Crawford
*Assistant Examiner* — Lester III Rushin
(74) *Attorney, Agent, or Firm* — FisherBroyles, LLP

(57) ABSTRACT

An arrangement for conveying an electronic device in a testing system includes a conveyor arrangement, a plate having at least one opening for the conveyor arrangement, and an elevator configured to elevate the conveyor arrangement through the at least one opening of the plate. The conveyor arrangement is configured to receive and convey the electronic device when the conveyor arrangement extends through the at least one opening. The elevator is further configured to lower the conveyor arrangement through the at least one opening of the plate. The plate is configured to receive the electronic device from the conveyor arrangement in response to lowering the conveyor arrangement through the at least one opening. The plate is further configured to move with respect to the conveyor arrangement, and to carry the electronic device to a testing area of the testing system.

12 Claims, 6 Drawing Sheets

CONVEYING ARRANGEMENT FOR TESTING SYSTEM

CROSS-REFERENCE TO RELATED APPLICATION

This application claims benefit to Finnish Application No. 20160282, filed Nov. 30, 2016, which is incorporated by reference herein in its entirety.

BACKGROUND

Field

The invention relates to testing systems for testing an electronic device. More particularly, the present invention relates to arrangement for conveying the electronic device in the testing system.

Description of the Related Art

Electronic devices, such as mobile phones, tablet computers, laptops and the like, may be beneficial to be tested in order to validate/verify their needed functionality. For example, when electronic devices are manufactured some or all of said devices may be tested in a radio frequency chamber in order to determine that the electronic devices are transmitting and/or receiving radio signals according to specifications. In another example, speaker of an electronic device may be tested in an audio chamber.

In the current testing systems, the delivery of an electronic device to a testing area may be performed using a robotic arm that grabs the electronic device from one location and delivers it to the testing area. Such method may, however, cause the electronic device to be in wrong position or in wrong location for the testing operation. This may be caused by the robotic arm having a multiple degrees of freedom during the delivery of the electronic device. Further, accurate configuration and/or adjustment of the robotic arm may be required which may increase maintenance work. Thus, in addition to the robotic arm itself being quite expensive, the possible additional maintenance work may even further increase costs.

Therefore, one purpose of this invention may be to provide a robust method and arrangement for delivering an electronic device to a testing area of a testing system. The testing area may be, for example, a drawer-type testing chamber.

SUMMARY

According to an aspect, there is provided an arrangement for conveying an electronic device in a testing system, the arrangement comprising: a conveyor arrangement; a plate comprising at least one opening for the conveyor arrangement; and an elevator configured to elevate the conveyor arrangement through the at least one opening of the plate, the conveyor arrangement configured to receive and to convey the electronic device when the conveyor arrangement extends through the at least one opening, the elevator further configured to lower the conveyor arrangement through the at least one opening of the plate, the plate configured to receive the electronic device from the conveyor arrangement in response to lowering the conveyor arrangement through the at least one opening, wherein the plate is further configured to move with respect to the conveyor arrangement and to carry the electronic device to a testing area of the testing system.

According to an aspect, there is provided a testing system for testing an electronic device, the system comprising: a conveyor arrangement; a plate comprising at least one opening for the conveyor arrangement; an elevator configured to elevate the conveyor arrangement through the at least one opening of the plate, the conveyor arrangement configured to receive and to convey the electronic device when the conveyor arrangement extends through the at least one opening, the elevator further configured to lower the conveyor arrangement through the at least one opening of the plate, the plate configured to receive the electronic device from the conveyor arrangement in response to lowering the conveyor arrangement through the at least one opening, wherein the plate is further configured to move with respect to the conveyor arrangement and to carry the electronic device to a testing area of the testing system; and test equipment for testing the electronic device.

One or more examples of implementations are set forth in more detail in the accompanying drawings and the description below. Other features will be apparent from the description and drawings, and from the claims.

BRIEF DESCRIPTION OF THE DRAWINGS

In the following embodiments will be described in greater detail with reference to the attached drawings, in which FIGS. 1 to 5 illustrate sequences/steps of conveying/moving the electronic device in the testing system;

DETAILED DESCRIPTION

The following embodiments are exemplifying. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

In order to ensure high quality and to reduce failures of manufactured communication devices, e.g. mobile phones, various testing processes are carried out on a production line. A testing station operates in production lines or as a stand-alone station in a product development environment. A testing cell tests various interfaces of communication devices, such as radio frequency communication, audio and user interfaces. All functions of the testing cell needed for the testing processes are typically automated.

As described above, the testing station may be generalized as testing area, which means that the electronic device (in some cases the device may be non-electrical also and the embodiments of the invention may be applicable to non-electronic devices also) is tested at the testing area. For example, the testing system may comprise one or more drawer-type testing stations or chambers, wherein the electronic device is placed on the drawer when the drawer-type testing station is open. For carrying out the test(s) at hand, the drawer is closed and thus the electronic device may be brought in to the testing station. After the test, the drawer may once again be opened, and the electronic device may then be conveyed to some other location on the testing system (e.g. similar testing chamber(s)) or to some other part of the production system (e.g. packaging). So one or more tests in one or more testing stations may be performed for the same electronic device.

Accordingly, there is provided an arrangement 10 for conveying an electronic device 100 in a testing system as shown, for example, in FIGS. 1 to 5. The arrangement does not necessarily require the described testing system, but may be utilized in other types of testing systems which are not necessarily explicitly disclosed. However, the described arrangement 10 may be particularly suitable for a drawer-type testing system comprising one or more drawer-type testing stations/chambers.

Figure 1:
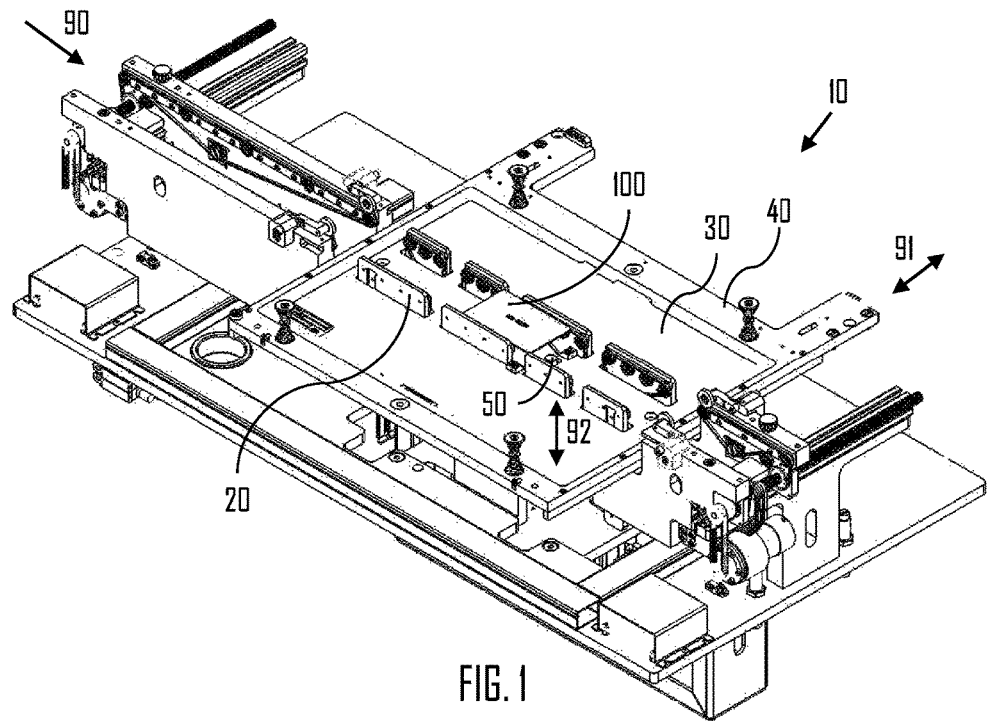
FIGS. 1 to 5 illustrate an arrangement for conveying an electronic device in a testing system according to some embodiments. According to some embodiments.
Figure 2:
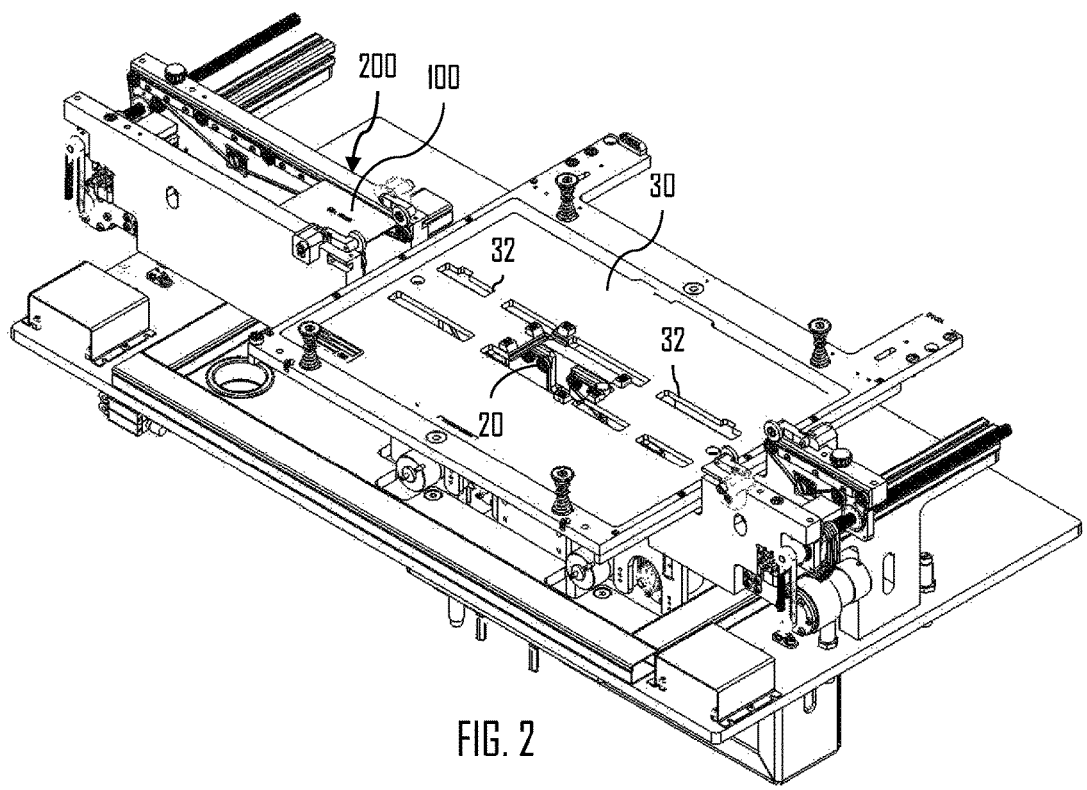
Figure 3:
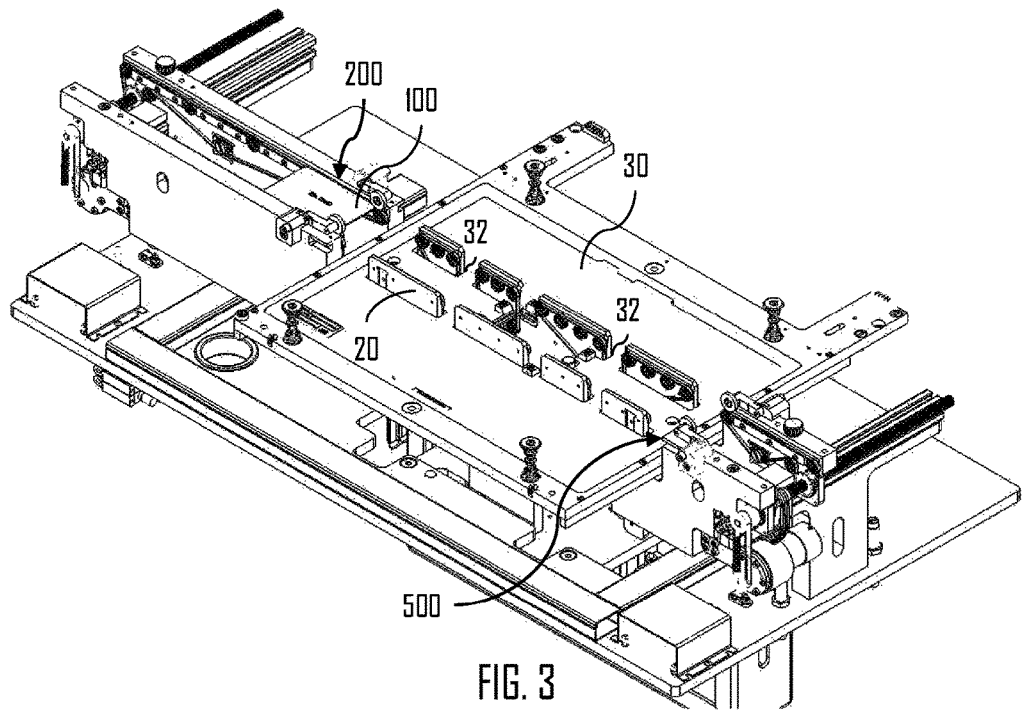
Figure 4:
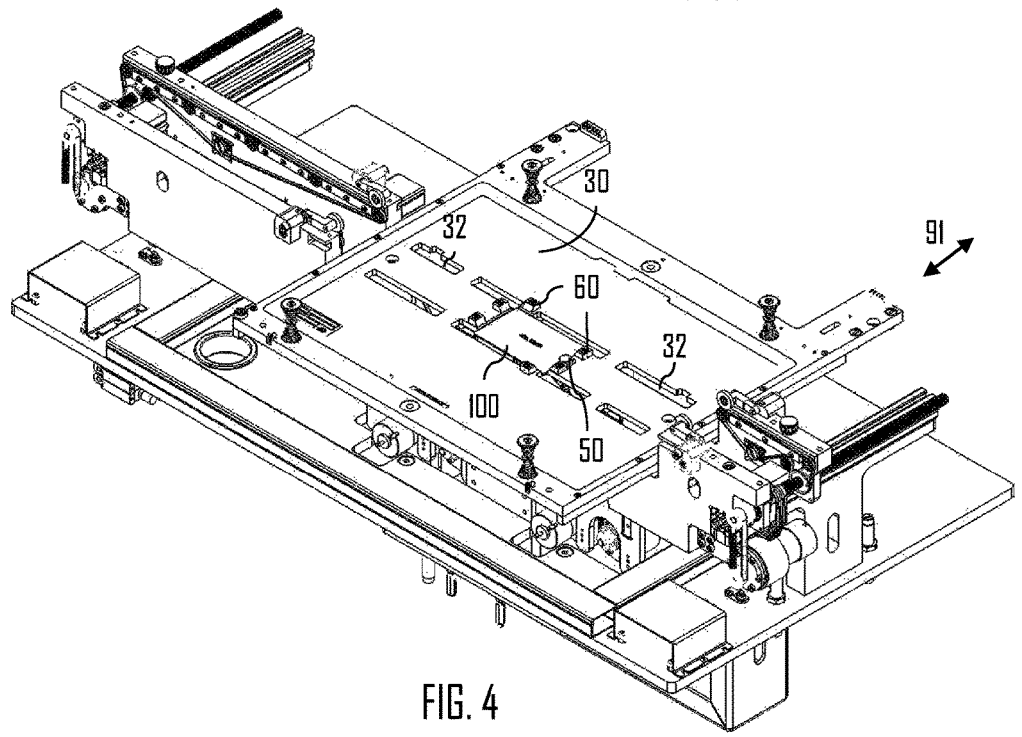
Figure 5:
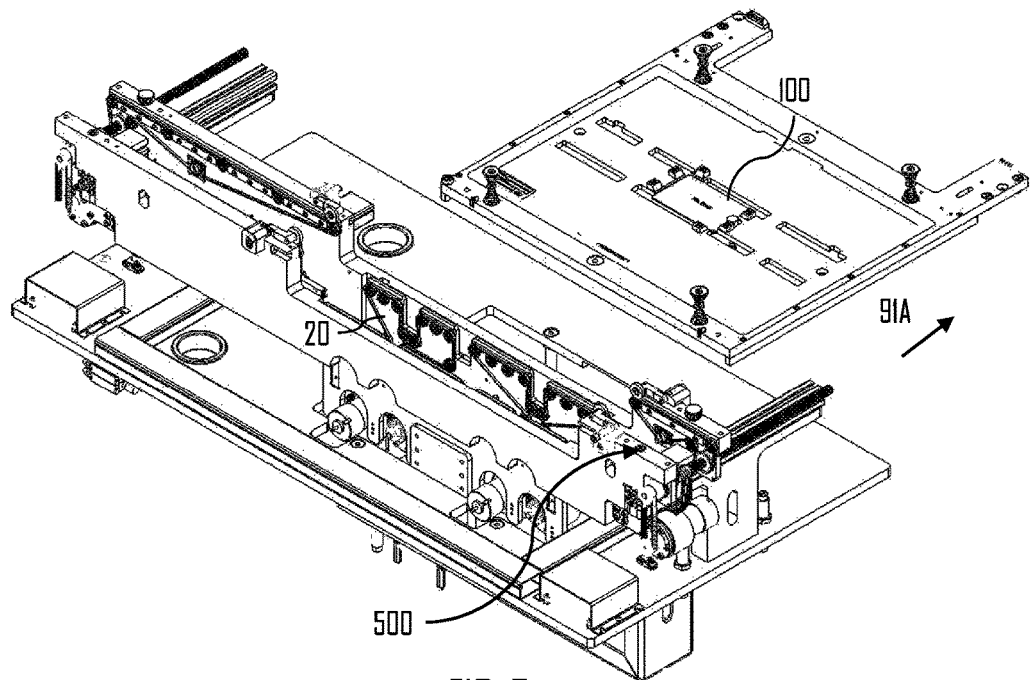

FIGS. 1 to 5 illustrate the arrangement 10 and the operation of the arrangement in different stages of the conveying operation. Conveying here may mean that the electronic device is moved from one position to another via plurality of stages. Thus, conveying may not necessarily require a conveyor. However, in the present solution, conveyor(s) are also utilized. Further, one example sequence of conveying the electronic device 100 may be illustrate such that FIG. 2 illustrates first step of the sequence, FIG. 3 illustrates the second step of the sequence, FIG. 1 illustrates the third step of the sequence, FIG. 4 illustrates the fourth step of the sequence, and FIG. 5 illustrates the fifth step of the sequence. The example sequence may show how the electronic device 100 is conveyed from an input area 200 (or simply first area) to a testing area (e.g. testing chamber) of the testing system. Similarly, the electronic device 100 may be conveyed back from the testing area to an output area 500 (or simply second area) of the testing system (this reverse operation is not shown in the Figures). In some embodiments, the input and output areas 200, 500 are the same (e.g. conveyor arrangement 20 conveys the electronic device 100 to one direction when the electronic device is conveyed to the testing area and to an opposite direction when the electronic device is conveyed from the testing area). In another embodiment, the input and output areas 200, 500 are different (e.g. the conveyor arrangement 20 conveys the electronic device 100 only to one direction).

So, according to an embodiment, the arrangement 10 comprises the conveyor arrangement 20 and a plate 30 comprising at least one opening 32 for the conveyor arrangement 20. Further, the arrangement 10 may comprise elevator for elevating the conveyor arrangement 20 through the at least one opening 32 of the plate 30, the conveyor arrangement 20 configured to receive and to convey the electronic device 100 when the conveyor arrangement 20 extends through the at least one opening 32. Further, the arrangement 10 may comprise the elevator for lowering (e.g. for both lowering and elevating) the conveyor arrangement 20 through the at least one opening 32 of the plate 30, the plate 30 being configured to receive the electronic device 100 from the conveyor arrangement 20 in response to lowering the conveyor arrangement 20 through the at least one opening 32. The plate 30 may further be configured to move with respect to the conveyor arrangement 20 and to carry the electronic device 100 to a testing area of the testing system. The elements described above may be seen, for example, in FIG. 1. However, some of the sequences may be illustrated in FIGS. 2 to 5 in more detail. Each of these FIGS. 1 to 5 is described now in more detail.

Referring first to FIG. 2, the electronic device 100 may be shown at the input area 200 of the testing system. Actually, the input area 200 may be a part of some other system, such as a production system. In any case, the electronic device may be brought to a certain location which is indicated by arrow 200. One example of delivering the electronic device 100 to the input area may be the use of one or more conveyors. Thus, for example, the electronic device 100 may be delivered to the input area using one or more conveyors of the testing system and/or the production system.

Still referring to FIG. 2, the at least one opening 32 is also shown. In fact, there may be a plurality of such openings that enable the conveyor 20 to elevate and lower through the plate 30. Elevation/lowering here may be accomplished by the plate moving up and down and/or the conveyor arrangement 20 moving up and down. However, according to an embodiment, the conveyor 20 is configured to move up and down (i.e. elevate and lower). For example, the conveyor arrangement 20 may comprise one or more lift conveyors. For example, the elevator of the arrangement may comprise one or more power producing members (e.g. motors, such as electric motor, or pneumatic member(s)) which enable the conveyor arrangement 20 and/or the plate 30 to move up and down. For example, the conveyor arrangement 20 may comprise one or more electronic motors configured to elevate and lower the conveyor arrangement according to instructions from a controller (CTRL). Example of such controller may be shown in FIG. 9 (CTRL 910).

Further, in FIG. 2, the conveyor arrangement 20 may be in a first position (also referred to as home or down position). That is, in the first position, the conveyor arrangement 20 may not extend through the at least one opening 32. However, this is not necessarily required and the conveyor arrangement could potentially be in some other position also.

Now referring to FIG. 3, the conveyor arrangement 20 may be shown in a second position (also referred to as work or up position). In the second position, the conveyor arrangement 20 may extend through the at least one opening 32. Thus, the conveyor arrangement 20 may receive the electronic device 100. According to an embodiment, the second position means that the conveyor arrangement is substantially aligned with the input area 200 (e.g. another conveyor of the testing system or the production system). Accordingly, in such case, the first position may mean that the conveyor arrangement 20 is situated substantially below the input area 200. The conveyor arrangement 20 may receive the electronic device 100 and convey the electronic device 100. Once again it is pointed out that the first and second position of the conveyor arrangement may be obtained by elevating/lowering the conveyor arrangement 20 and/or the plate 30. So, the first and second position may define the position of the conveyor arrangement 20 in relation to the plate 30.

Referring to FIG. 1, the electronic device 100 may be conveyed by the conveyor arrangement 20 (see the difference of position of the electronic device between situation of FIG. 3 and FIG. 1). Arrow 90 in FIG. 1 may show the direction of the conveying according to one example. Arrow 92 may show the direction of the elevating and lowering of the conveyor arrangement and/or the plate 30. However, in the situation of FIG. 1, the conveyor arrangement 20 may be in the second position (i.e. conveyor arrangement extends through the at least one opening 32 and is enabled to convey the electronic device 100 accordingly.

As described, the conveyor arrangement 20 may be driven into the first position so that the plate 30 may receive the electronic device 100. According to an embodiment, the electronic device 100 is received on the plate 30. This may happen in response to lowering the conveyor arrangement 20, for example (i.e. driving the conveyor arrangement 20 to the first position). So in other words, this may mean that the conveyor arrangement 20 conveys the electronic device 100 by physically touching the electronic device 100. When the conveyor arrangement 20 is lowered (i.e. does not anymore extend through the at least one opening 32), the plate 30 may physically touch the electronic device 100. E.g. the electronic device is placed on the plate 30. This may be seen in FIG. 4 in which the plate 30 has received the electronic device 100. The conveyor arrangement 20 may be situated below the plate 30 (i.e. not extending through the at least one opening 32. Thus, the plate 30 may be free to move with respect to the conveyor arrangement 20. The possible movement of the plate 30 may be shown with an arrow 91 in FIG. 4. According to an embodiment, the plate 30 is configured to move with respect to the conveyor arrangement 20. This may be enabled when the conveyor arrangement 20 is in the first position (i.e. not extending through the at least one opening 32). The movement may be perpendicular to the conveying direction by the conveyor arrangement 20. That is, arrows 91 and 90 may be perpendicular with each other. In fact, according to an embodiment, arrows 90, 91, and 92 are perpendicular with each other. Basically this may mean that the conveyor arrangement 20 may convey the electronic device 100 at least to a first direction (possibly also to a second direction opposite to the first direction), the elevator may move the conveyor arrangement 20 and/or the plate 30 in a third direction (e.g. elevation) and a fourth direction (e.g. lowering), and the plate 30 may be configured to carry the electronic device to a fifth direction (possibly also to a sixth direction being opposite to the fifth direction), wherein the first, third, and fifth directions are substantially perpendicular to each other. Such approach brings the benefit of reducing degrees of freedom of the movement in different stages of the process, but still having the ability to move the electronic device 3-dimensionally (e.g. step by step). Thus, the proposed solution brings clear benefits compared with the use of robotic arm, such as vacuum gripper or mechanical gripper. Also, with mechanical gripper, for example, the force used to grab the electronic device may cause damage to the electronic device. This may also be avoided using the proposed solution.

Referring to FIG. 5, the plate 30 may be configured to move or convey the electronic device 100 to the testing area once the plate 30 has received the electronic device (e.g. in response to or after receiving the electronic device 100). Direction of this movement is shown with an arrow 91A (i.e. towards the testing area). According to an embodiment, the plate 30 is comprised in a drawer-type testing station or chamber. Thus, the plate 30 may act as a drawer, wherein the plate 30 is configured to receive the electronic device 100 from the conveyor arrangement 20 when the drawer is open. The drawer may close and thus move or bring the electronic device into the testing station or chamber. The drawer-type station may thus comprise, for example, a sliding mechanism enabling the plate 30 to move (i.e. open and close the drawer). It also needs to be noted that the plate 30 may be a part of a frame that acts as a frame from the plate 30. That is, the arrangement 10 may further comprise a frame 40 configured to support the plate 30. The plate 30 may be coupled with the frame 40. Thus, when the frame 40 moves (i.e. drawer-type testing station is closed or opened), the plate 30 may move with the frame 40. The frame 40 enables the use of more than one plate (i.e. electronic device-specific plates). For example, the plate 30 may be changed when the electronic device size or type changes. This is discussed later in more detail.

According to an embodiment, the arrangement 10 comprises stopping element for stopping the conveying, by the conveyor arrangement 10, of the electronic device 100. The elevator for lowering the conveyor arrangement 10 may be configured to lower the conveyor arrangement 10 in response to stopping said conveying. The stopper element for stopping the conveying may comprise, for example, a stopping member 50 shown in FIG. 1. The stopping member 50 may be a part of the plate 30 or may be configured to elevate through the plate 30 via an opening of the plate 30. The stopping member 50, according to an embodiment, is a pneumatic stopping member configured to extend according to control message(s) from the CTRL 910. In more general terms, regardless whether for example a pneumatic or an electronic stopping member is used, the CTRL 910 may be configured to cause the stopping member 50 to extend in order to stop the conveying.

So, in general, the stopping member 50 is configured to move, according to control signal(s) from the CTRL 910, such that the stopping member 50 obstructs movement of the electronic device 100 when the electronic device is conveyed by the conveyor arrangement. The moving of the stopping member 50 may happen via electric motor and/or pneumatic force, for example. Accordingly, the stopping member 50 may be configured to move to enable the conveyor arrangement 20 to continue conveying of the electronic device 100. For example, this may happen, for example, when the electronic device 100 is conveyed to the output area 500. Such movement may also happen according to control signal(s) from the CTRL 910.

In an embodiment, the CTRL 910 is configured to control the conveyor arrangement 20. Thus, for example, the CTRL 910 may stop, start, accelerate and/or decelerate conveying of the electronic device 100 by the conveyor arrangement. E.g. the CTRL 910 may stop the conveyor arrangement 20 (e.g. stop one or more conveyors of the conveyor arrangement 20) Thus, the stopping member 50 is not necessarily required to stop the electronic device 100. However, stopping member 50 and CTRL 910 configured to stop/start the conveying by the conveyor arrangement 20 may both be utilized at the same time to make the system even more robust. FIG. 5 illustrates the stopping member 50 as a part of the plate 30 according to an embodiment. Thus, the stopping member 50 may act also as an additional guiding member to keep the electronic device 100 at a required position on the plate 30.

Figure 6A:
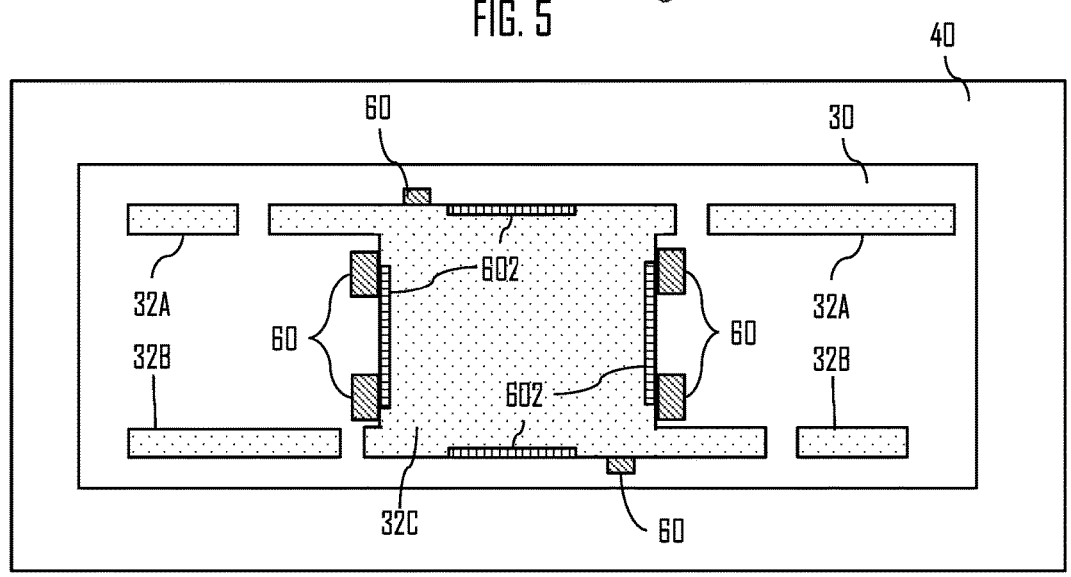
FIGS. 6A to 6D illustrate a plate of the arrangement according to some embodiments.

Let us now look at some further embodiments shown in FIGS. 6A to 6D. Referring to FIG. 6A, the arrangement 10 may further comprise the frame 40 supporting the plate 30, wherein the plate 30 is detachably attachable to the frame 40. The detachably attachable may mean that the plate 30 may be, for example, changed if need be. Thus, for example, different kind of electronic devices may be carried/conveyed and thus tested. For example, the frame 40 and the plate 30 may comprise one or more attachment members to enable the plate 30 to the attached to the frame 40. The attachment members may comprise, for example, screw(s) and/or squeezer(s). In some embodiments, glue may be used to secure the attachment. For example, heating the glue may enable the plate 30 to be detached from the frame 40.

In an embodiment, the frame 40 is configured to support a plurality of interchangeable electronic device-specific plates 30. For example, one plate may be for a first type of electronic device (e.g. having certain dimensions) and another plate may be for a second type of electronic device (e.g. having certain other dimensions). For example, each plate 30 may have plate specific at least one opening 32 for the conveyor arrangement 20.

Referring to FIG. 6A, the plate 30 may further comprise at least one recess 602 adapted and dimensioned to receive the electronic device 100 from the conveyor arrangement 20 in response to the lowering the conveyor arrangement 20 through the at least one opening 32. In FIG. 6A, the at least one opening 32 comprises a plurality of openings 32A, 32B, and 32C (e.g. five openings in total. However the number of openings may differ depending on the configuration of the system). The at least one recess may be visible, for example, also in FIG. 5 (but not numbered). Additionally, or alternatively, the plate 30 comprise one or more protrusions 60. The at least one recess 602 and the at least one protrusion 60 may enable the electronic device 100 to be aligned and/or positioned on the plate 30. I.e. when the plate 30 moves, the electronic device 100 may not move with respect to the plate 30. However, in some embodiments, the recess 602 and/or the protrusion 60 are not required as friction between the plate 30 and the electronic device 100 may be sufficient. For example, rubber or similar may be used on the plate 30 to increase friction. Rubber may also be used in addition to the recess 602 and/or the protrusion 60.

The at least one recess 602 may be understood as a slot for the electronic device in the plate 30. Thus the at least one recess 602 may be adapted and dimensioned such that the electronic device 100 fits relatively tightly into the at least one recess 602 (e.g. in to the slot). Thus, the electronic device 100 may be placed on the plate 30 such that the electronic device 100 is partially within the plate 30 and the edges of the at least one recess 602 keep the electronic device 100 in its place.

In an embodiment, the plate 30 comprises an additional opening, wherein the at least one recess 602 is situated at least a part of at least one wall of the additional opening. The additional opening may enable the electronic device 100 to be tested on two sides when the electronic device 100 is in the testing area. For example, in case of a mobile phone, the additional opening may enable testing of the user interface and the backside camera at the same time. In one example, the electronic device 100 may be easier to handle in the testing area when the device can be pinched from two opposite sides enabled by the additional opening. However, the additional opening may not be necessary in all embodiments. The additional opening may form a part of the slot for the electronic device. For example, the at least one recess 602 may at least partially encircle the additional opening.

In an embodiment, the plate 30 comprises a further opening 32C having at least one wall, the at least one recess 602 forming at least a part of the at least one wall. In FIG. 6A, the further opening 32C also enables the conveyor arrangement 20 to elevate and lower through the plate 30. So the further opening 32C may have more than one function. However, in some embodiments, the further opening 32C may be only configured to enable the electronic device to fall into the at least one recess 602 on the edges of said further opening 32C (see, for example, FIG. 6D). Benefit of this may be that the plate 30 does not need to be carved to have at least one recess 602 in the shape of the electronic device. Instead the further opening 32C may have been dimensioned according to the electronic device 100 such that the at least one recess 602 on the at least one wall receives the electronic device 100. Making an opening and carving at least some of the edges of the opening may be sometimes easier compared with using only carving.

Figure 6B:
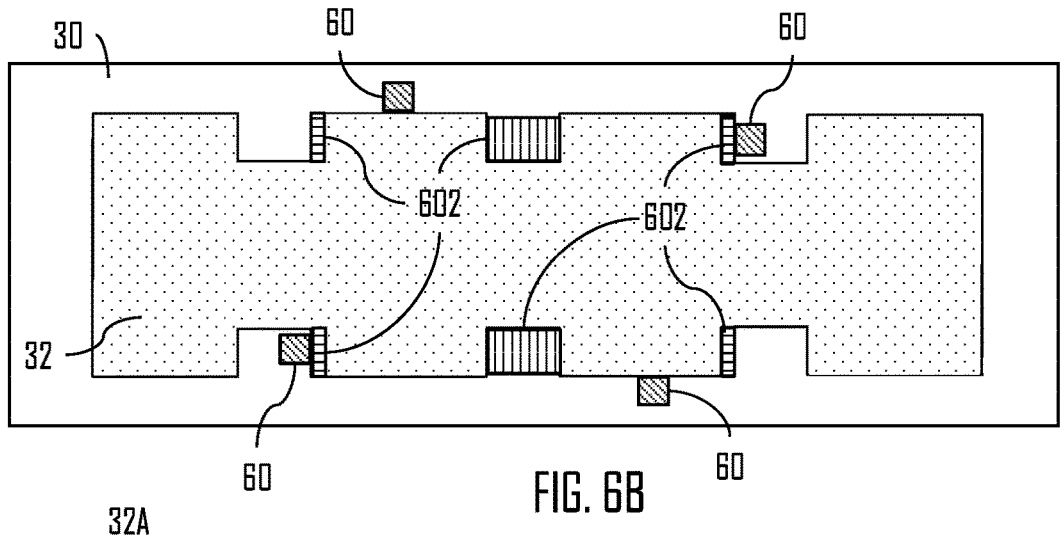
Figure 6C:
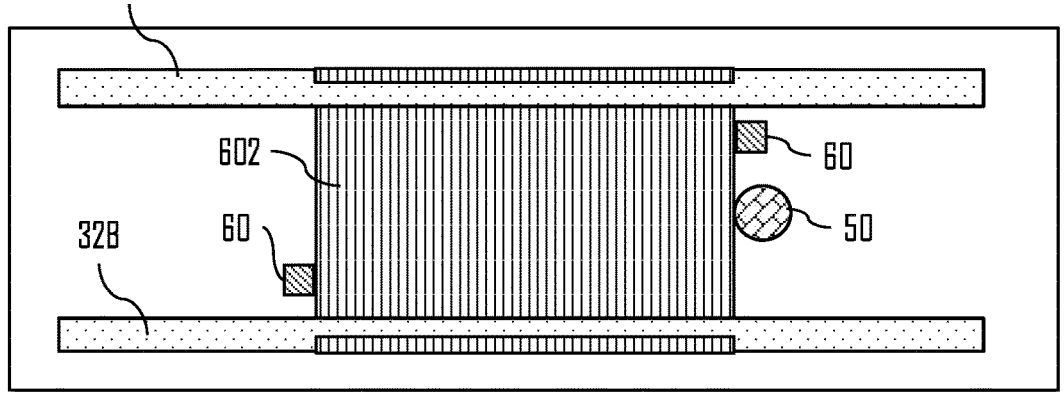
Figure 6D:
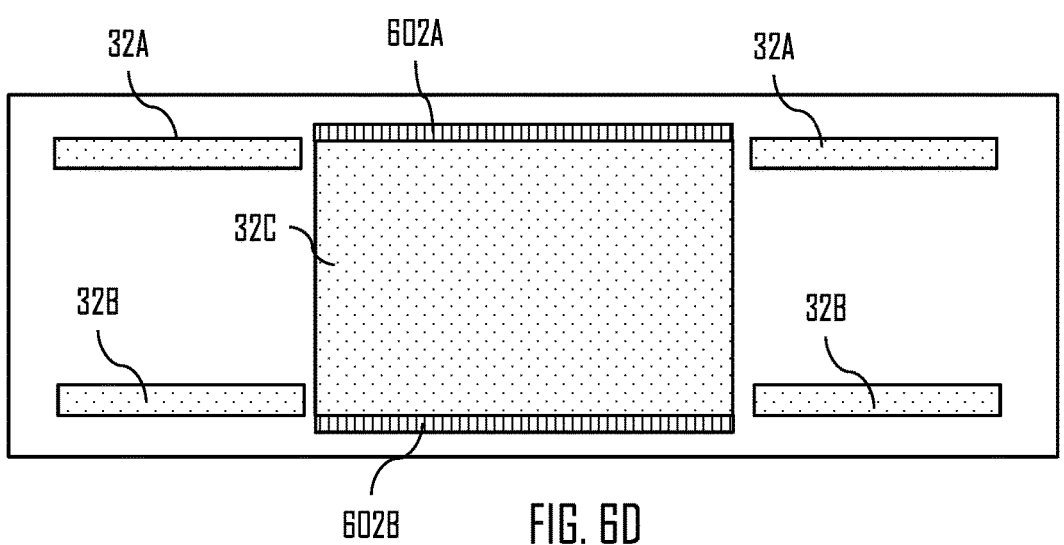

In an embodiment with reference to FIG. 6D, said further opening 32C is substantially rectangle (e.g. square), wherein the at least one recess 602A, 602B forms at least a part of a first wall of the substantially rectangle opening and at least a part of a second wall of the substantially rectangle opening, the first and second walls being non-adjacent walls of the substantially rectangle opening 32C. This can be seen in FIG. 6D, wherein the recess 602A and recess 602B are opposite to each other, i.e. on non-adjacent walls of the opening 32C. However, the recesses 602A and 602B also extend to the non-adjacent walls, and thus the electronic device is enabled to enter into the slot of the plate 30.

FIGS. 6B and 6C illustrate additional possibilities of configuring the plate 30 according to some embodiments. For example, in FIG. 6B, the plate comprises only one opening 32. This opening may enable the conveyor arrangement 20 to elevate and lower through the plate 30. Additionally, there may be protrusion(s) 60 and/or recess or recesses 602 for the electronic device 100 similar which was disclosed already above.

For example, in FIG. 6C, there may be two openings 32A, B for the conveyor arrangement 20. Additionally, there may be recess 602 for the electronic device 100. These are only a few examples of possible configurations of the plate 30. The main purpose in each example and embodiment is to enable the conveyor arrangement 20 to elevate and lower through the plate 30. Additionally, the plate 30 may comprise at least on recess 602 and/or at least one protrusion 60 to keep the electronic device 100 on a predetermined position when the plate 30 is used to carry the electronic device 100 to the testing area. It is further pointed out that term opening refers to a through-cut in the plate whereas recess refers to a cut that does not extend through the plate.

Figure 7A:
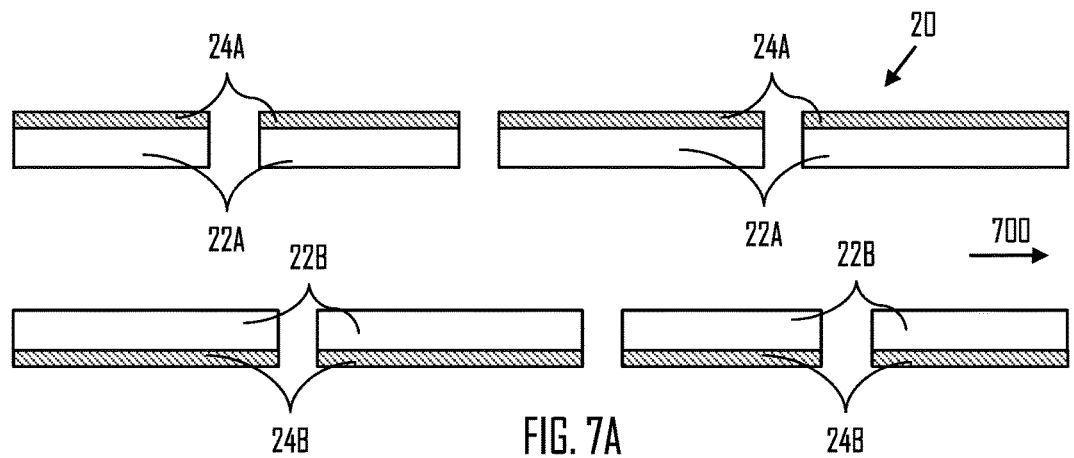
FIGS. 7A to 7C illustrate conveyor arrangement according to some embodiments.
Figure 7B:
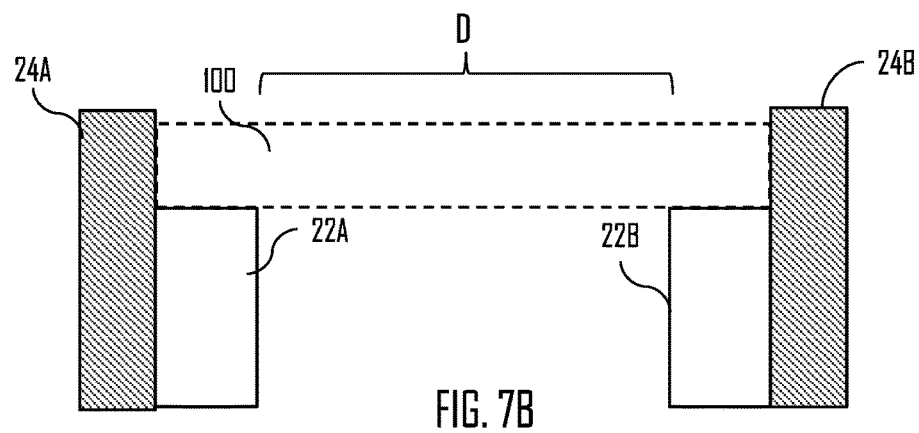

Let us then look closer on the conveyor arrangement 20. FIGS. 7A to 7B illustrate some embodiments. The conveyor arrangement 20 may comprise one or more conveyors. For example, a plurality of conveyors may be arranged in sequence (e.g. subsequently). FIG. 7A illustrates the conveyor arrangement according to an embodiment. Referring to FIG. 7A, the conveyor arrangement 20 comprises a plurality of protruding guiding elements 24A, 24B (also referred to as protruding elements 24A, 24B) forming a conveying path for the electronic device 100, wherein the conveyor arrangement 20 is configured to convey the electronic device along the conveying path. The conveying path may be formed between the protruding elements 24A, 24B. The conveying path may be illustrated with an arrow 700. However, the conveying path could be to opposite direction depending on the conveying direction (i.e. to which direction the conveyors are rotated.

In an embodiment, the conveyor arrangement 20 comprises a plurality of conveyors 22A, 22B. The plurality of conveyors 22A, 22B may be arranged between the protrusions 24A, 24B. The protrusions 24A, 24B and the conveyors 22A, 22B may also be seen, for example, in FIG. 1 although with no reference signs.

Referring to FIG. 7B, the conveyor arrangement 20 may be shown from a different perspective compared with the bird eye view of FIG. 7A. In FIG. 7B, the protrusions 24A, 24B may form walls such that the electronic device 100 is kept on the conveyors 22A, 22B. Without the protrusions 24A, 24B, the electronic device 100 could potentially fall of the conveyor 22A, 22B or tilt if the conveyors on different sides would not rotate at the same speed. However, the conveyor arrangement 20 may also operate without the protrusions 24A, 24B.

In an embodiment, the conveyor arrangement 20 comprises first and second conveyor arrangements 22A, 22B situated at least partially adjacent to each other. This can be seen in FIG. 7A, for example. Each of the first and second conveyor arrangements 22A, 22B may comprise one or more conveyors.

Moreover, by arranging the first and second conveyor arrangements 22A, 22B similarly as shown in FIG. 7A, the conveyor arrangement 20 may better convey smaller devices as the gaps between consecutive conveyors of the first conveyor arrangement 22A may be opposite to conveyors of the second conveyor arrangement 22B and the gaps between consecutive conveyors of the second conveyor arrangement 22B may be opposite to conveyors of the first conveyor arrangement 22A. That is, the gaps between conveyors may not situated directly opposite to each other in the described embodiment.

In an embodiment, the plurality of protruding guiding elements comprises at least one first protruding guiding element 24A supporting the first conveyor arrangement 22A and at least one second protruding guiding element 24B supporting the second conveyor arrangement 22B. In an embodiment, the first and second conveyor arrangements 22A, 22B are situated between the at least one first protruding guiding element 24A and the at least one second protruding guiding element 24B. Examples of this can be seen in FIG. 7A and FIG. 7B. As shown in FIG. 7A, there may be a plurality of first protruding guiding elements 24A and a plurality of second protruding guiding elements 24B. Each may support one or more conveyors of the conveyor arrangement 20.

The conveyors of the conveyor arrangement 20 may be in principal any kind of conveyor known in the art. However, belt conveyors may be particularly suitable for conveying the electronic device 100. The material(s) used in the belt(s) may be selected such that there is enough friction between the belt and the electronic device 100. If rollers are used, the rollers may also comprise material that has substantially high friction coefficient. For example, rubber may be used. For example, plastic may be used. For example, the belt and/or rollers may comprise a pattern to increase friction between the electronic device 100 and the conveyor arrangement 20.

Figure 7C:
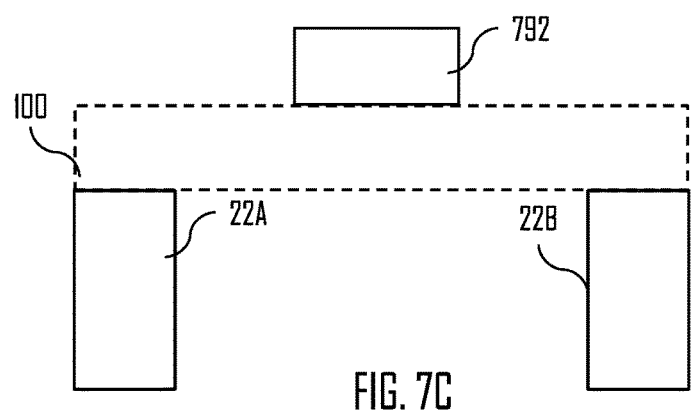

In an embodiment, the conveyor arrangement 20 comprises a pressure conveyor. That is, in addition to the described conveyor arrangement 20 described with various examples and embodiments above, the conveyor arrangement 20 comprises at least one further conveyor such that the conveyor arrangement is configured to physically touch the electronic device 100 on at least two surfaces of the electronic device 100. For example, the pressure conveyor may comprise a bottom conveyor and a top conveyor arranged such that the electronic device 100 is configured to be conveyed to a certain direction between the bottom and top conveyors. In an embodiment, the conveyor arrangement comprises an adjustment member, such as adjustment screws or hydraulics, configured to control distance between the bottom and top conveyors. In an embodiment, the first and second conveyor arrangements 22A, 22B form at least partly the bottom conveyor. The top conveyor may thus not hinder the bottom conveyor lowering and/or elevating and receiving, by the plate 30, the electronic device 100. When the bottom conveyor elevates through the plate 30, the top conveyor may eventually touch the electronic device's 100 opposite side. Hence, the electronic device 100 may be arranged between the bottom and top conveyors of which both may be configured to cooperatively convey the electronic device 100 according to instructions from the CTRL 910, for example. One example of the pressure conveyor may be seen in FIG. 7C, wherein the top conveyor 792 is shown. The protruding guiding elements 24A, 24B may be used or may not be used. Side pressing pressure conveyors may also be used.

In an embodiment, the arrangement 10 comprises an adjustment element configured to control distance D between the first and second conveyor arrangements 22A, 22B (example shown in FIG. 7B). Thus, the arrangement 10 may be made suitable for conveying multiple types of electronic devices (e.g. having different dimensions, such as width). The adjustment element may comprise, for example, adjustment screws and/or the first and second conveyor arrangements 22A, 22B may be coupled with one or more slides so that the position on the slide may be controlled. For example, the adjustment element may comprise one or more bars or rails, wherein the position of the first and/or second conveyor arrangements 22A, 22B is adjustable on the one or more bars or rails. Thus, using more than one conveyor may bring the benefit of higher adjustability of the system.

In an embodiment, the plate 30 is further configured to carry the electronic device 100 back from the testing area of the testing system, wherein the elevator is further configured to elevate the conveyor arrangement 20 through the at least one opening 32 of the plate 30 such that the conveyor arrangement 20 receives the electronic device from the plate 30. This may happen in response to the elevating the conveyor arrangement 20 through the at least one opening. Accordingly, in an embodiment, the conveyor arrangement 20 is further configured to convey the electronic device 100 from the input area 200 (e.g. input conveyor) to the plate 30 and from the plate 30 to an output area 500 (e.g. output conveyor). The plate 30 may therebetween move the electronic device 100 to the testing area and back from the testing area once the testing operation is performed. Once one electronic device is tested and carried to the output area 500, the arrangement 10 may be configured to receive a further electronic device (i.e. next electronic device to be tested), and perform operations as described above accordingly.

In an embodiment, the arrangement 10 further comprises a plurality of plates 30 each configured to carry an electronic device to a plate-specific testing area of the testing system, each plate comprising at least one opening for the conveyor arrangement 20. For example, the system may comprise two or more adjacent or subsequent testing areas (e.g. testing chambers/stations). In addition to this, the arrangement 10 may comprise two or more conveyor arrangements 20, wherein each conveyor arrangement is coupled with a certain plate and/or testing area. Each conveyor arrangement and plate pair may be controlled independently by the CTRL 910. Thus, the arrangement 10 may at the same time be used to carry two or more electronic devices to two or more adjacent or subsequent testing areas.

There is also provided, a system comprising the arrangement 10 and test equipment (e.g. testing chamber(s) or station(s)) for testing the electronic device or electronic devices.

Figure 8:
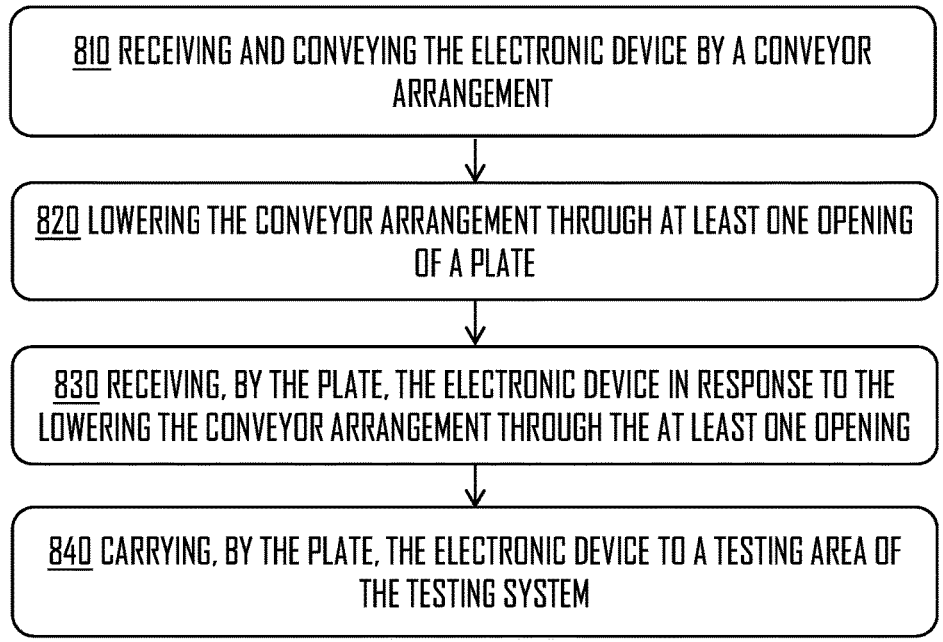
FIG. 8 illustrates a flow diagram of a method according to an embodiment.

FIG. 8 illustrates a flow diagram according to an embodiment. Referring to FIG. 8, a method for conveying an electronic device in a testing system is provided, wherein the method comprises: receiving and conveying the electronic device by a conveyor arrangement 20 (block 810); lowering the conveyor arrangement 20 through at least one opening 32 of a plate 30 (block 820); receiving, by the plate 30, the electronic device in response to the lowering the conveyor arrangement 20 through the at least one opening 32 (block 830); and carrying, by the plate 30, the electronic device to a testing area of the testing system (block 840). The method may additionally comprise reverse steps so that the electronic device may be carried from the testing area to an output area.

Figure 9:
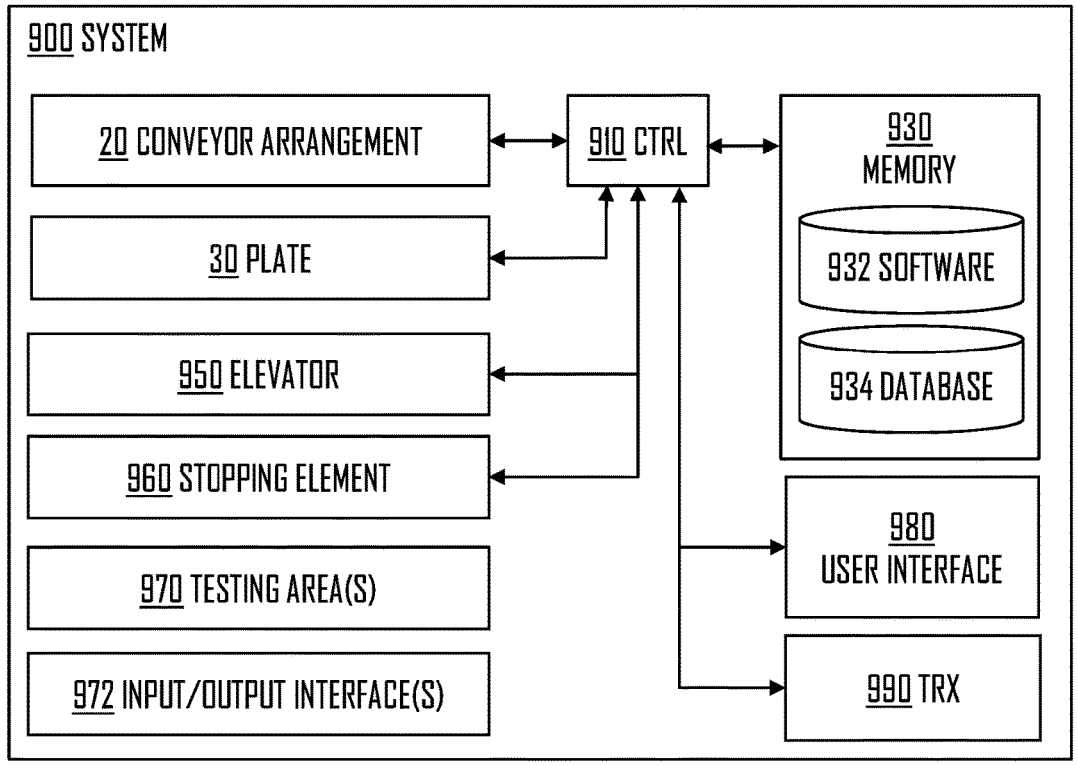
FIG. 9 illustrates a block diagram of the testing system according to an embodiment.

FIG. 9 illustrates a system according to an embodiment. The system 900 may be referred to as a testing system, for example. Referring to FIG. 9, the system 900 may comprise the conveyor arrangement 20, the plate 30, and elevator 950 (e.g. lift conveyor). Further, the system may comprise stopping element 960 (e.g. stopper 50 controlled by the CTRL 910 or CTRL 910 configured to stop the conveying by the conveyor arrangement 20).

Further, the system 900 may comprise one or more testing area(s) 970 (e.g. testing chambers or stations) to which the one or more plates are configured to carry the electronic devices to be tested. As said, the testing area(s) 970 may be, for example, placed subsequently one after another and/or opposite to each other (e.g. on different sides of the conveyor arrangement 20 such that the conveyor arrangement 20 is in between at least two testing areas). Even further, the system 900 may comprise the input and/or output interfaces 972 configured to enable the electronic device 100 to enter and leave said system 900.

As described earlier, the system 900 may comprise the CTRL 910 configured to control at least one of the conveyor arrangement 20, the plate 30 (or the frame 40 when the frame 40 is used to support the plate 30), the elevator 950, and the stopping element 960.

The system 900 may further comprise radio interface (TRX) 990 comprising hardware and/or software for realizing communication connectivity according to one or more communication protocols (e.g. Bluetooth, cellular communication, Wireless Local Area Network (WLAN) and/or LAN). The TRX may provide the apparatus with communication capabilities to enable remote control of the system 900, for example. The TRX may comprise standard well-known components such as an amplifier, filter, frequency-converter, (de)modulator, and encoder/decoder circuitries and one or more antennas.

The system 900 may comprise user interface 980 comprising, for example, at least one keypad, a microphone, a touch display, a display, a speaker, etc. The user interface 980 be used to control the system 900 by a user. For example, user interface 980 may be remotely used via the TRX 990.

According to an embodiment, the system 900 comprises a control circuitry (CTRL) 910, such as at least one processor, and at least one memory 930 including a computer program code (software) 932, wherein the at least one memory and the computer program code (software) 932, are configured, with the at least one processor, to cause the system to carry out any one of the embodiments of FIGS. 1 to 8, or operations thereof. Thus, the control by the CTRL 910 may be realized using at least one processor and at least one memory 930 comprising a software 932.

The memory 930, may be implemented using any suitable data storage technology, such as semiconductor based memory devices, flash memory, magnetic memory devices and systems, optical memory devices and systems, fixed memory and removable memory. The memory 930 may comprise a database 934 for storing data, such as control data for controlling the system 900 (e.g. parameters for different electronic devices).

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

What is claimed is:

1. An arrangement for conveying an electronic device in a testing system, the arrangement comprising:
   a conveyor arrangement;
   a plate comprising at least one opening for the conveyor arrangement; and
   an elevator configured to elevate the conveyor arrangement through the at least one opening of the plate, the conveyor arrangement configured to receive and to convey the electronic device when the conveyor arrangement extends through the at least one opening,
   the elevator further configured to lower the conveyor arrangement through the at least one opening of the plate, the plate configured to receive the electronic device from the conveyor arrangement in response to lowering the conveyor arrangement through the at least one opening,
   wherein the plate is further configured to move with respect to the conveyor arrangement and to carry the electronic device to a testing area of the testing system.

2. The arrangement of claim 1, further comprising
   a stopper element configured to stop the conveying, by the conveyor arrangement, of the electronic device, wherein the elevator is configured to lower the conveyor arrangement in response to stopping said conveying.

3. The arrangement of claim 1, further comprising a frame supporting the plate, wherein the plate is detachably attachable to the frame.

4. The arrangement of claim 3, wherein the frame is configured to support a plurality of interchangeable electronic device-specific plates.

5. The arrangement of claim 1, wherein the plate further comprises at least one recess adapted and dimensioned to receive the electronic device from the conveyor arrangement in response to the lowering the conveyor arrangement through the at least one opening.

6. The arrangement of claim 1, wherein the conveyor arrangement further comprises a plurality of protruding guiding elements forming a conveying path for the electronic device, wherein the conveyor arrangement is configured to convey the electronic device along the conveying path.

7. The arrangement of claim 1, wherein the conveyor arrangement comprises first and second conveyor arrangements situated at least partially adjacent to each other.

8. The arrangement of claim 7, wherein the plurality of protruding guiding elements comprises at least one first protruding guiding element supporting the first conveyor arrangement and at least one second protruding guiding element supporting the second conveyor arrangement, wherein the first and second conveyor arrangements are situated between the at least one first protruding guiding element and the at least one second protruding guiding element.

9. The arrangement of claim 1, wherein the plate is further configured to carry the electronic device back from the testing area of the testing system, and wherein the elevator is further configured to elevate the conveyor arrangement through the at least one opening of the plate such that the conveyor arrangement receives the electronic device from the plate.

10. The arrangement of claim 9, wherein the conveyor arrangement is further configured to convey the electronic device from an input area to the plate and from the plate to an output area.

11. The arrangement of claim 10, further comprising a plurality of plates each configured to carry an electronic device to a plate-specific testing area of the testing system, each plate comprising at least one opening for the conveyor arrangement.

12. A testing system for testing an electronic device, the system comprising:
   a conveyor arrangement;
   a plate comprising at least one opening for the conveyor arrangement;
   an elevator configured to elevate the conveyor arrangement through the at least one opening of the plate, the conveyor arrangement configured to receive and to convey the electronic device when the conveyor arrangement extends through the at least one opening, the elevator further configured to lower the conveyor arrangement through the at least one opening of the plate, the plate configured to receive the electronic device from the conveyor arrangement in response to lowering the conveyor arrangement through the at least one opening, wherein the plate is further configured to move with respect to the conveyor arrangement and to carry the electronic device to a testing area of the testing system; and
   test equipment for testing the electronic device.

* * * * *